(12) United States Patent
Cho et al.

(10) Patent No.: US 11,348,947 B2
(45) Date of Patent: May 31, 2022

(54) MANUFACTURING METHOD FOR ARRAY SUBSTRATE AND ARRAY SUBSTRATE

(71) Applicants: HKC Corporation Limited, Guangdong (CN); CHONGQING HKC OPTOELECTRONICS TECHNOLOGY CO., LTD., Chongqing (CN)

(72) Inventors: En-tsung Cho, Chongqing (CN); Yiqun Tian, Chongqing (CN)

(73) Assignees: HKC Corporation Limited, Guangdong (CN); Chongqing HKC Optoelectronics Technology Co., Ltd., Chongqing (CN)

( * ) Notice: Subject to any disclaimer, the term of this patent is extended or adjusted under 35 U.S.C. 154(b) by 538 days.

(21) Appl. No.: 16/331,288

(22) PCT Filed: May 22, 2018

(86) PCT No.: PCT/CN2018/087772
§ 371 (c)(1),
(2) Date: Mar. 7, 2019

(87) PCT Pub. No.: WO2019/169740
PCT Pub. Date: Sep. 12, 2019

(65) Prior Publication Data
US 2021/0327913 A1    Oct. 21, 2021

(30) Foreign Application Priority Data

Mar. 9, 2018    (CN) .......................... 201810195542.7

(51) Int. Cl.
*H01L 27/12*    (2006.01)
*H01L 29/45*    (2006.01)
(Continued)

(52) U.S. Cl.
CPC ........ *H01L 27/1222* (2013.01); *H01L 27/127* (2013.01); *H01L 27/1214* (2013.01);
(Continued)

(58) Field of Classification Search
CPC ............ H01L 27/1222; H01L 27/1288; H01L 27/127; H01L 27/1237
See application file for complete search history.

(56) References Cited

U.S. PATENT DOCUMENTS 6,890,856 B2    5/2005   Kim et al.
8,633,066 B2    1/2014   Lee et al.
(Continued)

FOREIGN PATENT DOCUMENTS

CN    101656230 A    2/2010
CN    102027578 A    4/2011
(Continued)

OTHER PUBLICATIONS

Chinese Office Action for corresponding Chinese Application No. 201810195542.7 dated Mar. 18, 2020, 6 pages.
(Continued)

*Primary Examiner* — Ahmed N Sefer
(74) *Attorney, Agent, or Firm* — Rosenberg, Klein & Lee

(57) ABSTRACT

The present disclosure discloses a manufacturing method for an array substrate and an array substrate. The method includes: forming a gate electrode, a gate insulating layer, a semiconductor layer, a source drain electrode layer and a photoresist layer on a substrate; patterning the photoresist layer to form a patterned photoresist layer; performing at least one wet etching on the source drain electrode layer and performing at least one dry etching on the semiconductor layer; performing an ashing processing between the steps of the wet etching and the dry etching. A ratio of a lateral (Continued)

etching rate to a longitudinal etching rate in the at least one ashing processing ranges from 1:0.9 to 1:1.5.

19 Claims, 10 Drawing Sheets

(51) Int. Cl.
    *H01L 29/786* (2006.01)
    *H01L 29/66* (2006.01)

(52) U.S. Cl.
    CPC ...... *H01L 27/1237* (2013.01); *H01L 27/1259* (2013.01); *H01L 27/1288* (2013.01); *H01L 29/458* (2013.01); *H01L 29/66765* (2013.01); *H01L 29/78618* (2013.01); *H01L 29/78669* (2013.01); *H01L 29/78678* (2013.01)

(56) References Cited

U.S. PATENT DOCUMENTS

| | | | | |
|---|---|---|---|---|
| 2007/0048662 | A1* | 3/2007 | Park | G03F 7/105 430/270.1 |
| 2007/0232067 | A1 | 10/2007 | Hirota et al. | |
| 2009/0047758 | A1* | 2/2009 | Yamazaki | H01L 29/66765 438/158 |
| 2009/0114917 | A1* | 5/2009 | Yamazaki | H01L 29/04 257/59 |
| 2010/0075450 | A1* | 3/2010 | Choi | G02F 1/1368 438/30 |
| 2011/0273639 | A1* | 11/2011 | Xie | H01L 27/124 349/43 |
| 2012/0028421 | A1* | 2/2012 | Yang | H01L 21/32138 438/158 |
| 2013/0032793 | A1* | 2/2013 | Kim | H01L 27/1237 257/43 |
| 2014/0151682 | A1* | 6/2014 | Saito | H01L 27/124 257/43 |
| 2014/0183527 | A1* | 7/2014 | Yamazaki | H01L 21/3085 257/43 |
| 2015/0077162 | A1* | 3/2015 | Yamazaki | H01L 29/41733 327/109 |
| 2016/0043105 | A1* | 2/2016 | Jeong | H01L 29/458 257/72 |
| 2018/0061995 | A1* | 3/2018 | Kimura | H01L 29/41733 327/109 |
| 2018/0212043 | A1* | 7/2018 | Sun | H01L 21/3081 |
| 2018/0308879 | A1 | 10/2018 | Liu | |
| 2019/0280016 | A1* | 9/2019 | Cho | H01L 27/127 |

FOREIGN PATENT DOCUMENTS

| | | |
|---|---|---|
| CN | 102148259 A | 8/2011 |
| CN | 102629573 A | 8/2012 |
| CN | 106505033 A | 3/2017 |
| CN | 106684037 A | 5/2017 |

OTHER PUBLICATIONS

International Search Report for corresponding Application No. PCT/CN2018/087772 dated Dec. 13, 2018, 2 pages.

* cited by examiner

MANUFACTURING METHOD FOR ARRAY SUBSTRATE AND ARRAY SUBSTRATE

CROSS REFERENCE TO RELATED APPLICATIONS

This is a National Stage application of, and claims priority to, PCT/CN2018/087772 filed May 22, 2018, which further claims priority to Chinese Patent Application No. 201810195542.7 filed Mar. 9, 2018, the disclosures of which are incorporated herein by reference in their entirety.

TECHNICAL FIELD

The present disclosure relates to the field of display technology, and more particularly relates to a manufacturing method for an array substrate and an array substrate.

BACKGROUND

The active switch is a key device of a display panel, which plays an important role in the performance of the display panel. With the rapid development of electronic equipment, the electronic equipment is required to have lower power consumption and better endurance. Therefore the lower power consumption of the display panel in the electronic equipment is required.

In the display panel, an array substrate with an active switch is arranged. At present, the active switch is usually a thin film transistor, and a leakage current of the thin film transistor is relatively large. In addition, photo-generated carriers are also generated when light is irradiated onto the active switch, and the leakage current of the active switch is further increased, resulting in large power consumption of the display panel and poor stability performance of the active switch.

SUMMARY

According to various embodiments of the present disclosure, a manufacturing method for an array substrate and an array substrate are provided to reduce a leakage current of an active switch on the array substrate and improve the stability of the active switch.

A manufacturing method for an array substrate is provided according to an embodiment of the present disclosure, and the manufacturing method for an array substrate includes: providing a substrate; forming a gate electrode, a gate insulating layer, a semiconductor layer, a source drain electrode layer and a photoresist layer on said substrate, wherein said semiconductor layer includes an active layer and a doped layer; patterning said photoresist layer to form a patterned photoresist layer, wherein said patterned photoresist layer includes a first thickness area and a second thickness area, and a thickness of said first thickness area is less than said thickness of said second thickness area; performing at least one wet etching on said source drain electrode layer to form a source electrode and a drain electrode of said active switch and performing at least one dry etching on said semiconductor layer to form a channel area of said active switch, by using said patterned photoresist layer; and performing at least one photoresist ashing between steps of said wet etching and said dry etching; wherein a ratio of a lateral etching rate to a longitudinal etching rate in said at least one photoresist ashing ranges from 1:0.9 to 1:1.5.

An array substrate is provided according to an embodiment of the present disclosure, and the array substrate can be formed by the manufacturing method provided above. Said array substrate includes a substrate and an active switch on said substrate.

Said active switch includes: a gate electrode on said substrate; a gate insulating layer on said gate electrode; a semiconductor layer on said gate insulating layer; wherein said semiconductor layer includes an active layer and a doped layer on said active layer, said doped layer includes a first area and a second area that are isolated from each other; and a source electrode on said first area of said doped layer and a drain electrode on said second area of said doped layer.

A distance between a projection contour of said active layer on said substrate and a projection contour of said source electrode or a projection contour of said drain electrode on said substrate is less than 1.2 microns; and the distance between said projection contour of said doped layer on said substrate and said projection contour of said source electrode or said projection contour of said drain electrode on said substrate is less than 0.8 microns.

A manufacturing method for a transistor of an array substrate is provided according to an embodiment of the present disclosure, said manufacturing method for a transistor of an array substrate includes: forming a gate electrode on a substrate; forming a gate insulating layer on said gate electrode; forming a semiconductor layer on said gate insulating layer, wherein said semiconductor layer includes an active layer and a doped layer on said active layer; forming a source drain electrode layer on said doped layer; forming a photoresist layer on said source drain electrode layer; exposing and developing said photoresist layer to obtain a first photoresist pattern, said first photoresist pattern including a first thickness area, a second thickness area and a hollow area, a thickness of said first thickness area being less than said thickness of said second thickness area, said hollow area exposing said source drain electrode layer; performing a first-time wet etching on said source drain electrode layer, taking said first photoresist pattern as a first mask; performing a first-time ashing processing on said first photoresist pattern to obtain a second photoresist pattern; performing a first-time dry etching on said semiconductor layer, taking said second photoresist pattern as a second mask; performing a second-time ashing processing on said second photoresist pattern to obtain a third photoresist pattern, wherein said first thickness area is removed in said second ashing processing; performing a second-time wet etching on said source drain electrode layer to form a source electrode and a drain electrode of a transistor, taking said third photoresist pattern as a third mask; performing a third-time ashing processing performed on said third photoresist pattern to obtain a forth photoresist pattern; performing a second-time dry etching on said doped layer to form a channel area of the transistor, taking said forth photoresist pattern as a forth mask; and removing said forth photoresist pattern.

In said first ashing processing, said second ashing processing and said third ashing processing, a ratio of a lateral etching rate to a longitudinal etching rate ranges from 1:0.91:1.5.

According to the manufacturing method for an array substrate, by adding the step of photoresist ashing between the steps of wet etching and dry etching, and controlling the ratio of the lateral etching rate to the longitudinal etching rate to range from 1:0.9 to 1:1.5, the length of the photoresist layer exceeding the source drain electrode layer is reduced.

Meanwhile, the portion of each functional layer uncovered by the photoresist layer is removed in the process of the dry etching, so that the length of the semiconductor layer exceeding the source electrode and the drain electrode is reduced, and the leakage current of the active switch on the array substrate can be reduced and the electrical stability of the active switch can be improved.

BRIEF DESCRIPTION OF THE DRAWINGS

To illustrate the technical solutions according to the embodiments of the present disclosure or the examples of the technologies more clearly, the accompanying drawings for describing the embodiments or the examples of the technologies are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

In order to make the purpose, technical solutions and advantages of the present disclosure clearer, the technical solutions of the present disclosure will be clearly and completely described in the following with reference to the accompanying drawings. It is obvious that the embodiments to be described are only a part rather than all of the embodiments of the present disclosure. All other embodiments obtained by persons skilled in the art based on the embodiments of the present disclosure without creative efforts shall fall within the protection scope of the present disclosure.

Figure 1:
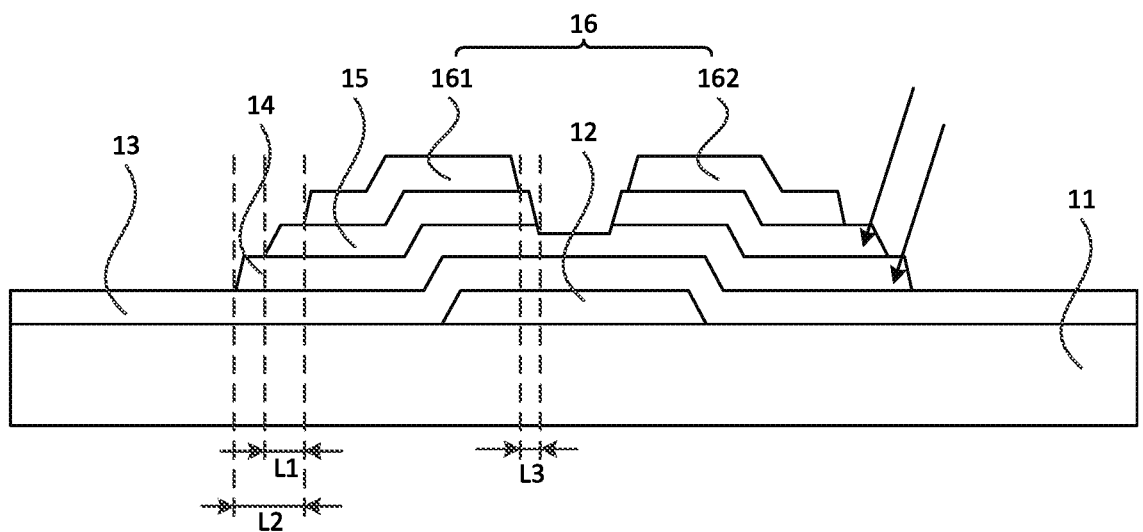
FIG. 1 is a schematic diagram of an active switch on an array substrate according to related arts.

FIG. 1 is a structural diagram of an active switch on an array substrate according to the related art. Referring to FIG. 1, the active switch includes a substrate 11, a gate electrode 12, a gate insulating layer 13, an active layer 14 (usually formed of an amorphous silicon material, so may also be referred to as an amorphous silicon layer 14), a doped layer 15, a source electrode 161, and a drain electrode 162. The gate electrode 12 and the source electrode 161 of the active switch are isolated by the gate insulating layer 13, so does the gate electrode 12 and the drain electrode 162 of the active switch. Therefore the active switch is actually an insulated gate type field effect transistor. The active switch can be divided into N-type and P-type.

Herein, the N-type active switch is taken as an example to explain the working principle of the active switch. When a positive voltage greater than a threshold voltage of the N-type active switch is applied to the gate electrode 12, an electric field is generated between the gate electrode 12 and the active layer 14. Under the effect of the electric field, a conductive channel is formed in the active layer 14 to form a conducting state between the source electrode 161 and the drain electrode 162. The larger the voltage applied to the gate electrode 12, the larger the conductive channel is. At this time, when a voltage is applied between the source electrode 161 and the drain electrode 162, there are carriers pass through the conductive channel. When a voltage lower than a break-over voltage of the N-type active switch is applied to the gate electrode 12, there is no conductive channel formed in the active layer 14, and a non-conducting state is formed between the source electrode 161 and the drain electrode 162. The doped layer 15 is formed between the active layer 14 and the source electrode 161 for reducing a resistance between the active layer 14 and the source electrode 161, and also formed between the active layer 14 and the drain electrode 162 for reducing a resistance between the active layer 14 and the drain electrode 162. In the actual manufacturing process of the active switch, an edge of the formed amorphous silicon layer 14 exceeds an edge of the source drain electrode 16, i.e., an amorphous silicon tail L2 is formed. And an edge of the formed doped layer 15 exceeds an edge of the source drain electrode 16, i.e., an outer tail L1 of the doped layer channel and an inner tail L3 of the doped layer channel are formed. These three types of tails, especially the amorphous silicon tail L2, are irradiated by visible light emitted from a backlight module of the liquid crystal display panel, which causes a light leakage current generated. Thereby it further increases a leakage current of the active switch, resulting in large power consumption of the display panel. Moreover, it also results in unstable electrical performance of the active switch.

Figure 2:
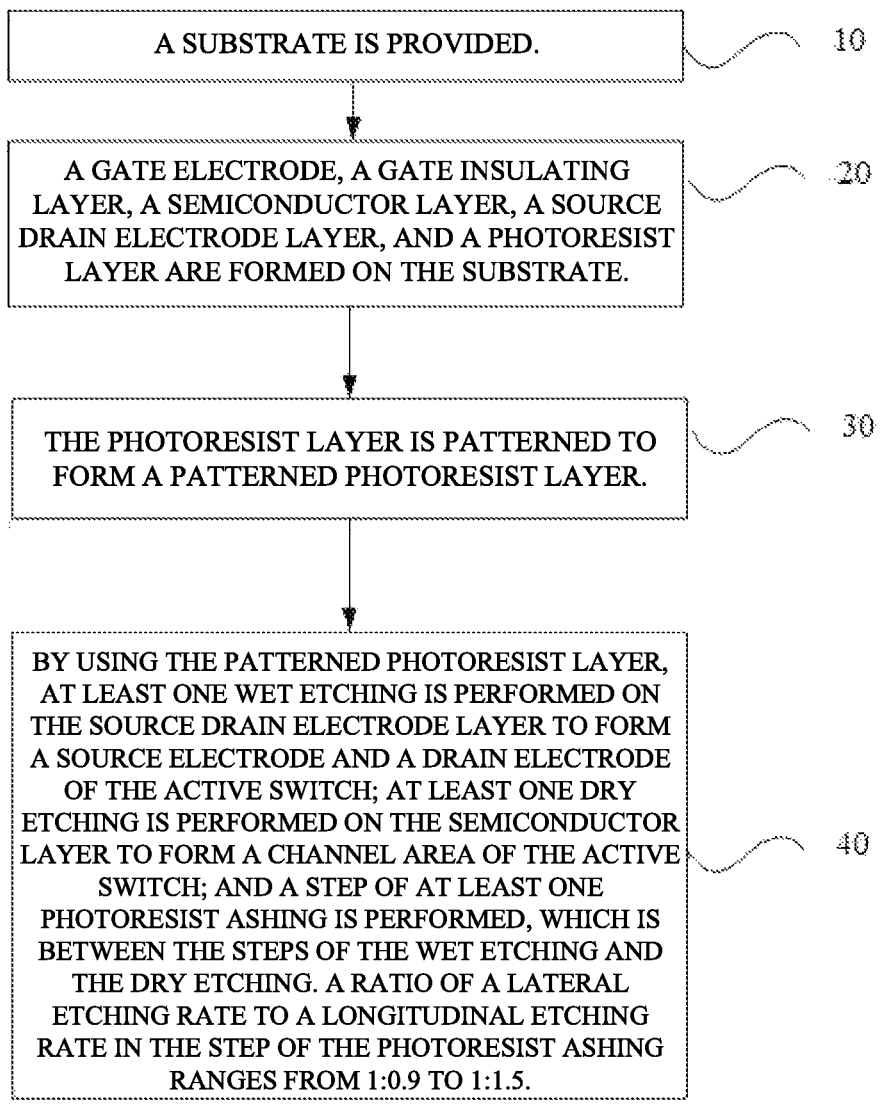
FIG. 2 is a flow chart of a manufacturing method for an array substrate according to an embodiment of the present disclosure.

In order to solve this problem, a manufacturing method for an array substrate including a plurality of active switches is provided according to an embodiment of the present disclosure. Referring to FIG. 2, FIG. 2 is a flow chart of the manufacturing method for an array substrate according to an embodiment of the present disclosure. Exemplarily, it includes the following steps.

In step S10, a substrate is provided.

In this embodiment, the substrate may optionally be a glass base or a flexible base such as polyimide (PI). Those skilled in the art can understand that for different application products and application scenarios of an active switch on the array substrate, different base materials of the array substrate are selected. Obviously the base materials include but not limited to the glass base and the flexible base. Any material that can be used as the base of the array substrate falls within the scope of the present disclosure.

In step S20, a gate electrode, a gate insulating layer, a semiconductor layer, a source drain electrode layer, and a photoresist layer are formed on the substrate.

In this embodiment, a constituent material of the gate electrode may optionally be aluminum (Al) or molybdenum (Mo). The constituent material of the gate insulation layer is silicon nitride (SiN). The semiconductor layer may include an active layer and a doped layer, wherein the constituent material of the active layer is amorphous silicon (a-Si). The constituent material of the doped layer is heavily doped amorphous silicon, which, exemplarily, may include N-type doped amorphous silicon or P-type doped amorphous silicon. The constituent material of the source drain electrode layer is molybdenum nitride, aluminum, and molybdenum nitride (MoN/Al/MoN) stacked in sequence. The constituent material of the photoresist layer includes resin, photosensitizer, solvent, and additive, wherein the photosensitizer is a photosensitive component in the photoresist layer, when irradiated with radiant energy, in the form of light, such as ultraviolet ray, a photochemical reaction will occur. The photoresist can be divided into positive photoresist and negative photoresist in terms of application characteristics. For the positive photoresist, the portion irradiated by the ultraviolet ray can be dissolved in the developing solution because of the chemical properties are changed. On the contrary, for the negative photoresist, the portion irradiated by the ultraviolet ray cannot be dissolved by the developing solution because of the change of the chemical properties. In this embodiment, the positive photoresist is taken as an exemplary example to illustrate. Those skilled in the art will understand that the constituent materials of each film of the array substrate include but are not limited to the above examples, and the constituent materials of any film structure of the array substrate fall within the scope of the present disclosure. The manufacturing process of each film structure is not specific in the present disclosure, and any constituent material of the film structure of the array substrate falls within the scope of the present disclosure.

In step S30, the photoresist layer is patterned to form a patterned photoresist layer.

In this embodiment, the photoresist layer is patterned to form a patterned photoresist layer. In subsequent steps of wet etching and/or dry etching, the source drain electrode layer and the semiconductor layer, which are covered by the photoresist layer, will not be etched away. The source drain electrode layer and the semiconductor layer, which are not covered by the photoresist layer, that is, the exposed source drain electrode layer and the semiconductor layer will be etched away.

In step S40, by using the patterned photoresist layer, at least one wet etching is performed on the source drain electrode layer to form a source electrode and a drain electrode of the active switch; at least one dry etching is performed on the semiconductor layer to form a channel area of the active switch; and a step of one photoresist ashing is performed, which is between the steps of the wet etching and the dry etching. A ratio of a lateral etching rate to a longitudinal etching rate in the step of the photoresist ashing ranges from 1:0.9 to 1:1.5.

In this embodiment, the wet etching may include etching the source drain electrode layer using a mixed solution of phosphoric acid ($H_3PO_4$), acetic acid ($CH_3COOH$) and nitric acid ($HNO_3$); etching the semiconductor layer (including the active layer and the doped layer) using vacuum plasma. An etching gas may include a mixed gas of sulfur hexafluoride ($SF_6$) and chlorine ($Cl_2$), or the etching gas may include a mixed gas of sulfur hexafluoride ($SF_6$), oxygen ($O_2$), and helium (He).

Because the wet etching has isotropic characteristics, i.e., the lateral etching rate and the longitudinal etching rate are commeasurable, that is, a width of the lateral etching is close to a depth of the longitudinal etching for the source drain electrode layer. As thus, the pattern of the photoresist layer and the pattern of the source drain electrode layer will have a certain deviation. That is, the metal material of the source drain electrode layer is retracted by a distance from the photoresist layer, exemplarily being 1.5 to 3 microns. while the dry etching of the semiconductor layer (including the active layer and the doped layer) tends to be the etching in a vertical direction, so that the portion covered by the photoresist layer is hardly etched away, i.e., comparing to the source electrode and the drain electrode to be formed, and the overlying photoresist, the semiconductor layer (including the active layer and the doped layer) is hardly retracted.

In the manufacturing method for an array substrate according to an embodiment of the disclosure, by setting a step of at least one photoresist layer ashing again and controlling the ratio of the lateral etching rate to the longitudinal etching rate in the step of the photoresist ashing to range from 1:0.9 to 1:1.5, the portion of the photoresist layer exceeding the source drain electrode layer can be reduced, and the deviation of the pattern of the photoresist layer from the pattern of the source drain electrode layer is reduced or even eliminated. So that since the pattern of the semiconductor layer (including the active layer and the doped layer) and the pattern of the photoresist layer are commeasurable in the subsequent etching process, the portion of the semiconductor layer (including an active layer and a doped layer) exceeding the source electrode and the drain electrode is reduced. In other word, the amorphous silicon tail, the outer tail of the doped layer channel and the inner tail of the doped layer channel are all smaller. Thereby the probability of generating the leakage current by the reaction of the semiconductor layer (including the active layer and the doped layer) with the visible light is reduced. That is, the leakage current of the active switch on the array substrate is reduced, and the electrical performance of the active switch is stable.

Figure 3:
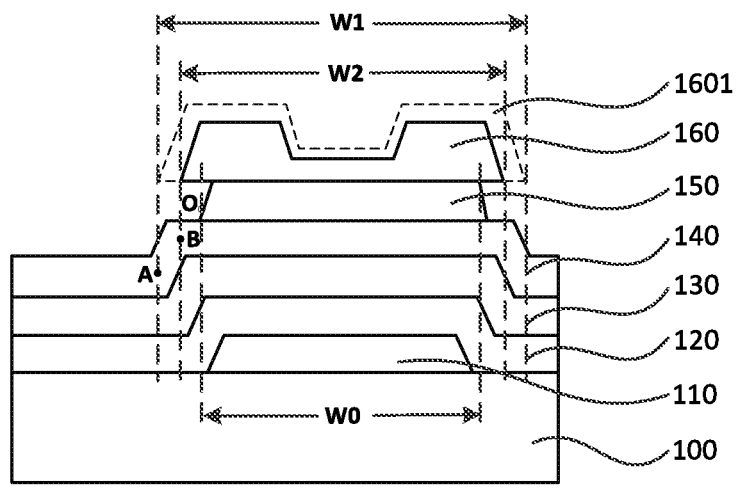
FIG. 3 is a schematic diagram of comparison of film structures before and after ashing a photoresist layer in a manufacturing method for an array substrate according to an embodiment of the present disclosure.

FIG. 3 is an exemplary schematic diagram of comparison of film structure before and after the ashing of a photoresist layer in the manufacturing method for an array substrate according to an embodiment of the disclosure. Referring to FIG. 3, taking the bottom gate type active switch formed on an array substrate as an example, a gate electrode 110, a gate insulating layer 120, a semiconductor layer (including an active layer 130 and a doped layer 140), a source drain electrode layer 150, and a photoresist layer 160 are sequentially deposited on a substrate 100. An original photoresist layer 1601 represents the photoresist layer before performing the step of the photoresist layer ashing, W1 represents the width of the photoresist layer 160 before performing the step of the photoresist ashing, and point A represents a boundary point of the corresponding doped layer 140 when the step of the photoresist ashing is not performed; W2 represents the width of the photoresist layer 160 after performing the step of the photoresist layer ashing, and point B represents a boundary point corresponding to the doped layer 140 after performing the step of the photoresist ashing; W0 represents the width of the source drain electrode layer 150, and point O represents a boundary point of the source drain electrode layer 150. As shown in FIG. 3, the step of the photoresist ashing is performed so that the original photoresist layer 1601 is diminished to the photoresist layer 160, the width of the photoresist layer 160 is reduced from W1 to W2, i.e., it tends to be closer to the width W0 of the source drain electrode layer 150. The boundary point of the corresponding doped layer 140 is changed from point A to point B. That is, it tends to be closer to the point O of the source drain electrode layer 150. Since an aspect of the increase of the leakage current in the active switch is caused by absorption of the visible light, the manufacturing method for the array substrate according to the embodiment of the present disclosure reduces the portion of the semiconductor layer (including the active layer 130 and the doped layer 140) exceeding the source drain electrode layer 150. Thus the leakage current of the active switch on the array substrate can be reduced.

Figure 4:
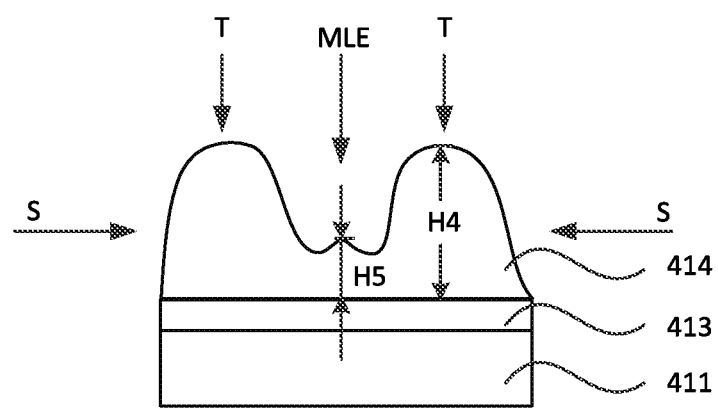
FIG. 4 is a schematic diagram of an etching direction of a photoresist layer in a manufacturing method for an array substrate according to an embodiment of the present disclosure.

Exemplarily, FIG. 4 is a schematic diagram of an etching direction of a photoresist layer in a manufacturing method for an array substrate according to an embodiment of the disclosure. Referring to FIG. 4, a functional layer 413 (which may include a gate electrode, a gate insulating layer, a semiconductor layer, and a source drain electrode layer, not specifically divided in FIG. 4, all shown as 413) and a patterned photoresist layer 414 are formed on a substrate 411. In the step of the photoresist ashing, the ratio of the lateral (direction S in FIG. 4) etching rate to the longitudinal (direction T in FIG. 4) etching rate ranges from 1:0.9 to 1:1.5. Exemplarily, H4 is located at a location corresponding to a source area or a drain area of the active switch and H5 is located at a location corresponding to a channel area of the active switch. Due to the micro-island effect in the ashing process of the photoresist layer 414, as shown as MLE in the FIG. 4, that is, a thickness of the photoresist layer 414 is thinner in the adjacent position corresponding to the H5 of the photoresist layer 414. Thus, by controlling the etching rate reasonably during the ashing process, the photoresist layer 414 corresponding to the channel area of the active switch can be completely removed under the premise that the pattern of the photoresist layer 414 is ensured to be similar to the pattern of the source drain electrode layer (seeing the source drain electrode layer 150 in FIG. 3).

Optionally, the manufacturing method includes twice wet etchings and twice dry etchings. The wet etchings and dry etchings are alternately performed. Specifically, the method includes the following steps: a first-time wet etching, in which the source drain electrode layer is patterned to form a metal conductor structure with a source area, a drain area and an active area; a first-time dry etching, in which an island structure of the semiconductor layer (including the active layer and the doped layer) is formed, that is, the semiconductor layer (including the active layer and the doped layer) is patterned; a second-time wet etching, in which the source drain electrode layer is patterned and the source electrode is formed in the source area, the drain electrode is formed in the drain area; and a second-time dry etching, in which the semiconductor layer (including the active layer and the doped layer) is etched, that is, the semiconductor layer (including an active layer and a doped layer) is etched to be open, to form an active switch structure on the array substrate.

Optionally, the manufacturing method includes performing the step of the photoresist ashing three times, and each step of the photoresist ashing is arranged between adjacent steps of the wet etching and the dry etching. Specifically, one step of the photoresist ashing can be performed between each wet etching and each dry etching. That is, the whole process including patterning the photoresist layer, twice wet etchings, twice dry etchings and performing the steps of the photoresist ashing three times is: patterning the photoresist layer, the first-time wet etching, the first-time photoresist layer ashing, the first-time dry etching, the second-time photoresist layer ashing, the second-time wet etching, the third-time photoresist ashing and the second-time dry etching. Combined with FIG. 3, by performing the step of the photoresist ashing each time, the width of the photoresist layer 160 can be reduced on the basis of the adjacent step of the etching, so that the pattern of the photoresist layer 160 differs little from or is the same as the pattern of the source drain electrode layer 150. Thus, the length of the semiconductor layer exceeding the source drain electrode layer 150 (after forming the active switch, the source drain electrode layer 150 forms the source electrode and drain electrode) can be reduced in the subsequent etching process. Thereby the leakage current of the active switch on the array substrate is reduced.

Figure 5:
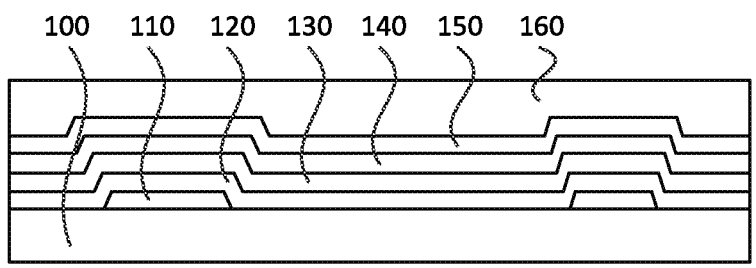
FIG. 5 is a structural schematic diagram of a film structure after depositing a photoresist layer in a manufacturing method for an array substrate according to an embodiment of the present disclosure.
Figure 6:
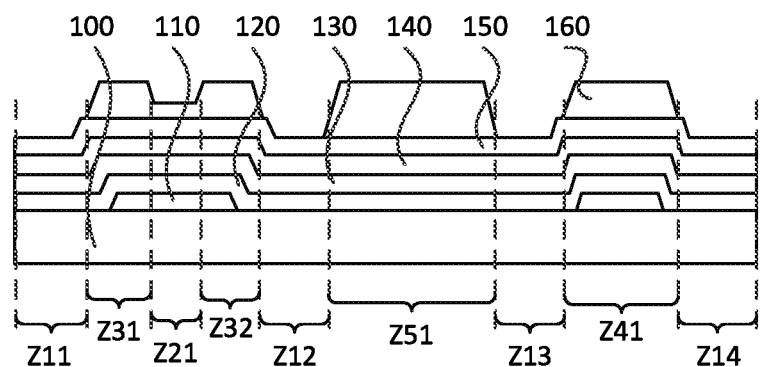
FIG. 6 is a schematic diagram of a film structure after patterning a photoresist layer in a manufacturing method for an array substrate according to an embodiment of the present disclosure.
Figure 7:
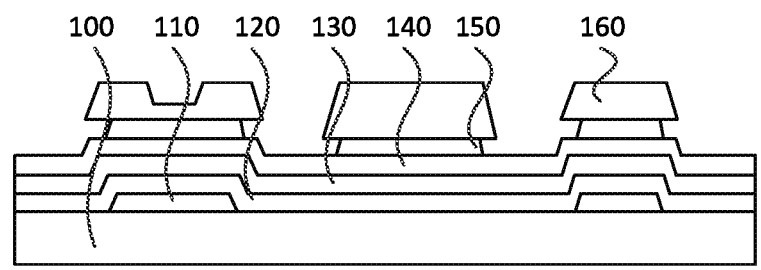
FIG. 7 is a schematic diagram of a film structure after a first-time wet etching in a manufacturing method for an array substrate according to an embodiment of the present disclosure.
Figure 8:
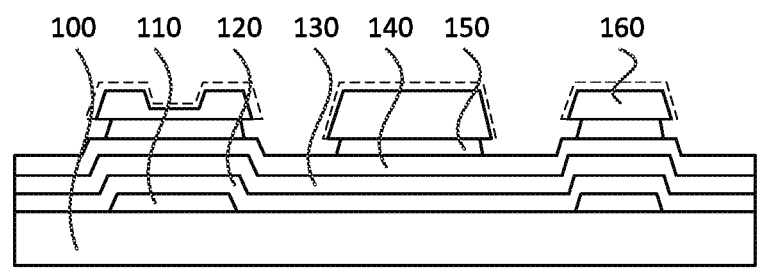
FIG. 8 is a schematic diagram of a film structure after a first-time photoresist ashing in a manufacturing method for an array substrate according to an embodiment of the present disclosure.
Figure 9:
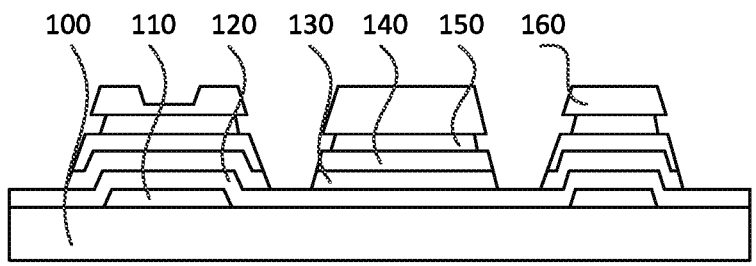
FIG. 9 is a schematic diagram of a film structure after a first-time dry etching in a manufacturing method for an array substrate according to an embodiment of the present disclosure.
Figure 10:
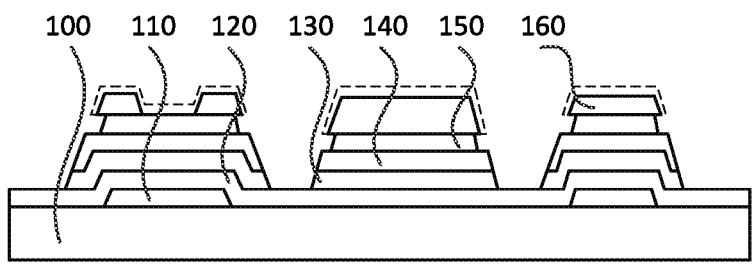
FIG. 10 is a schematic diagram of a film structure after a second-time photoresist ashing in a manufacturing method for an array substrate according to an embodiment of the present disclosure.
Figure 11:
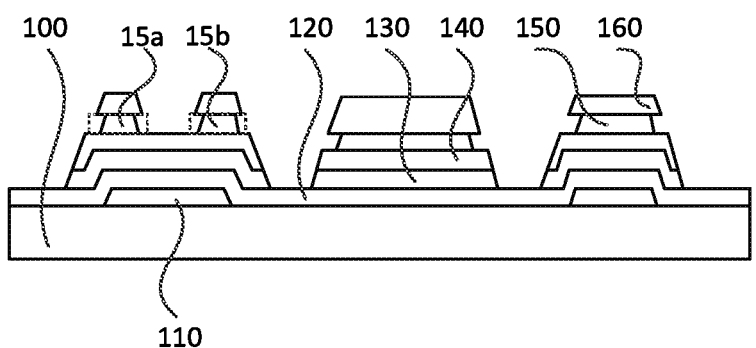
FIG. 11 is a schematic diagram of a film structure after a second-time wet etching in a manufacturing method for an array substrate according to an embodiment of the present disclosure.
Figure 12:
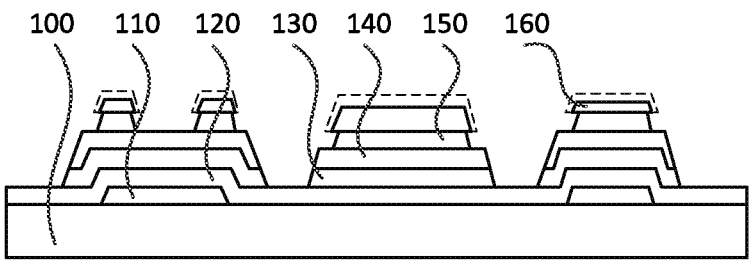
FIG. 12 is a schematic diagram of a film structure after a third photoresist ashing in a manufacturing method for an array substrate according to an embodiment of the present disclosure.
Figure 13:
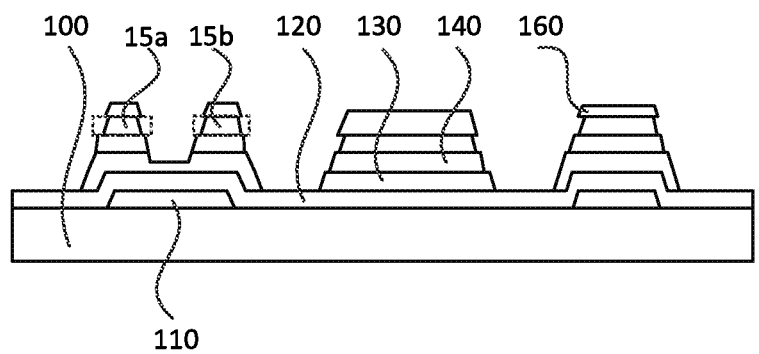
FIG. 13 is a schematic diagram of a film structure after a second-time dry etching in a manufacturing method for an array substrate according to an embodiment of the present disclosure.

Exemplarily, FIG. 5 to FIG. 13 show the schematic diagrams of a film structure formed after each step in the manufacturing method for an array substrate based on steps of twice wet etchings, twice dry etchings, and three times photoresist ashing according to an embodiment of the present disclosure. Taking the bottom gate type active switch formed on an array substrate as an example, reference numerals are used in FIG. 5 to FIG. 13 as well. Specifically, FIG. 5 is a schematic diagram of the film structure after depositing the photoresist layer in the manufacturing method for an array substrate according to an embodiment of the disclosure. Referring to FIG. 5, the specific structure may include: a provided gate electrode 110; a gate electrode 110, a gate insulating layer 120, a semiconductor layer (including an active layer 130 and a doped layer 140), a source drain electrode layer 150, and a photoresist layer 160 formed sequentially on the substrate 100, wherein the source drain electrode layer 150 may include a molybdenum nitride layer, an aluminum layer, and a molybdenum nitride layer which are sequentially stacked. FIG. 6 is a schematic diagram of the film structure after patterning the photoresist layer in the manufacturing method for an array substrate according to an embodiment of the disclosure. Referring to FIG. 6, the patterned photoresist layer 160 can be divided correspondingly into exposed areas Z11, Z12, Z13 and Z14, corresponding to the completely removed areas of the layers, except the insulating layer 120, in the active switch formed on the array substrate; a first thickness area Z21 corresponding to the channel area of the active switch; second thickness areas Z31 and Z32 corresponding to the source area and drain area of the active switch; and third thickness areas Z41 and Z51 corresponding to the metal conductor structure. Patterning the photoresist layer is for dividing the active switch formed subsequently on the array substrate into different functional areas. FIG. 7 is a schematic diagram of the film structure after the first-time wet etching in the manufacturing method for an array substrate according to an embodiment of the present disclosure. Combined with FIG. 6 and FIG. 7, the source drain electrode layer 150 corresponding to the exposed areas Z11, Z12, Z13, and Z14 of the photoresist layer 160 is removed to form a metal conductor structure with a source area, a drain area and an active area. FIG. 8 is a schematic diagram of the film structure after the first-time photoresist ashing in the manufacturing method for an array substrate according to an embodiment of the present disclosure. Referring to FIG. 8, the width of the photoresist layer 160 after the first-time photoresist ashing is narrowed relative to the width of the photoresist layer before the first-time photoresist ashing (seeing the comparison of the contours of the dashed lines and the solid lines in FIG. 8, the dashed lines represents the photoresist layer 160 before the first-time photoresist ashing; and the solid line represents the photoresist layer 160 after the first-time photoresist ashing). In this way, in the subsequent step of the first-time dry etching, the semiconductor layer (including the active layer 130 and the doped layer 140) uncovered by the photoresist layer 160 can be etched away accordingly, so that the portion of the semiconductor layer (including the active layer 130 and the doped layer 140) exceeding the source drain electrode layer 150 is getting smaller, and the leakage current is reduced. FIG. 9 is a schematic diagram of the structure of the film structure after the first-time dry etching in the manufacturing method for an array substrate according to an embodiment of the present disclosure. Referring to FIG. 9, the first-time dry etching removes the semiconductor layer (including the active layer 130 and the doped layer 140) uncovered by the photoresist layer 160 to form an island structure of the semiconductor layer (including the active layer 130 and the doped layer 140), i.e., patterning the semiconductor layer (including the active layer 130 and the doped layer 140). FIG. 10 is a schematic diagram of the film structure after the second-time photoresist ashing in the manufacturing method for an array substrate according to an embodiment of the present disclosure. Combined with FIG. 6 and FIG. 10, in the step of the second-time photoresist ashing, the photoresist corresponding to the first thickness area Z21 of the photoresist layer 160 is completely removed to expose the source drain electrode layer 150 of the channel area, and meanwhile the width of the photoresist of other portion are narrowed relative to the width before the step of the second-time photoresist ashing. In this way, in the step of the subsequent second-time wet etching, the amount of retraction of the source drain electrode layer 150 relative to the photoresist layer 160 becomes less than the amount of retraction in the examples of the technologies. And further, in the subsequent step of etching the semiconductor layer (including the active layer 130 and the doped layer 140), the portions of the semiconductor layer (including the active layer 130 and the doped layer 140) uncovered by the photoresist layer 160 are etched away, that is, the portions of the semiconductor layer (including the active layer 130 and the doped layer 140) exceeding the source drain electrode layer 150 are further reduced, thereby the leakage current is further reduced. FIG. 11 is a schematic diagram of the structure of the film structure after the second-time wet etching in the manufacturing method for an array substrate according to an embodiment of the present disclosure. Combined with FIG. 6 and FIG. 11, the source drain electrode layer 150 is patterned by the second wet etching to form a source electrode 15a of the active switch in the source area (the area corresponding to the second thickness area Z31 of the photoresist layer 160) and a drain electrode 15b of the active switch in the drain area (the area corresponding to the second thickness area Z32 of the photoresist layer). FIG. 12 is a schematic diagram of the film structure after the third-time photoresist ashing in the manufacturing method for an array substrate according to an embodiment of the present disclosure. Referring to FIG. 12, the width of the photoresist layer 160 after the step of the third-time photoresist ashing is narrowed relative to the width of the photoresist before the step of the third-time photoresist ashing (seeing the comparison of the contours of the dashed lines and the solid lines in FIG. 12, the dashed line represents the photoresist layer 160 before the third-time photoresist ashing; and the solid line represents the photoresist layer 160 after the third-time photoresist ashing). In this way, in the subsequent step of the second dry etching, the semiconductor layer (including the active layer 130 and the doped layer 140) uncovered by the photoresist layer 160 can be etched away accordingly, so that the portion of the semiconductor layer (including the active layer 130 and the doped layer 140) exceeding the source drain electrode layer 150 is further reduced, and the leakage current is further reduced. FIG. 13 is a schematic diagram of the film structure after the second-time dry etching in the manufacturing method for an array substrate according to an embodiment of the present disclosure. Referring to FIG. 13, after the second-time dry etching, the semiconductor layer (including the active layer 130 and the doped layer 140) is etched to be open, and an active switch structure has been formed. It should be noted that FIG. 5 to FIG. 13 illustrate a formation flow for forming an array substrate, particularly the formation flow of the active switch on the array substrate, wherein the portion of the latter figure reduced relative to the previous figure is the portion removed in the corresponding step.

By adding the step of the photoresist ashing, the coverage of the photoresist layer 160 to the semiconductor layer (including the active layer 130 and the doped layer 140) is reduced. So that in the step of the dry etching, the semiconductor layer (including the active layer 130 and the doped layer 140) that can be etched away are increased, that is, in the active switch finally formed on the array substrate, the portion of the semiconductor layer (including the active layer 130 and the doped layer 140) exceeding the source drain electrode layer 150 is reduced (including that the portion of the active layer 130 exceeding the source electrode 15a and the drain electrode 15b is reduced; and the portion of the doped layer 140 exceeding the source electrode 15a and the drain electrode 15b is reduced). Thus, the probability of absorbing light and generating photo-generated carriers of the semiconductor layer in the active switch is reduced, the leakage current of the active switch is reduced, and correspondingly the stability of the active switch is improved.

Optionally, in the step of the photoresist ashing, the etching gas includes sulfur hexafluoride and oxygen.

In the step of the photoresist ashing, plasmas are generated by the gas under the effect of a radio frequency power supply in a vacuum environment. The plasmas bombard a surface of the photoresist layer with high energy, or react with the surface of the photoresist layer, so that the photoresist layer is ashed, i.e., the photoresist layer is thinned or removed.

Optionally, when the ratio of the lateral etching rate to the longitudinal etching rate is 1:0.9, the etching gas is oxygen; when the ratio of the lateral etching rate to the longitudinal etching rate is 1:1.5, the etching gas is sulfur hexafluoride and oxygen, and the flow ratio of sulfur hexafluoride and oxygen ranges from 0.02 to 0.1.

In this case, when the etching gas is oxygen, the lateral etching rate is faster, and by increasing the gas of sulfur hexafluoride, the longitudinal etching rate of the photoresist layer can be accelerated. Therefore, the ratio of the lateral etching rate to the longitudinal etching rate of the photoresist layer can be controlled to vary from 1:0.9 to 1:1.5.

Optionally, the flow of sulfur hexafluoride is in the range of 200-800 sccm, and the flow of oxygen is in the range of 8000-10000 sccm, so that the ratio of the lateral etching rate to the longitudinal etching rate of the photoresist layer 160 is in the range of 1:0.9~1:1.5.

Alternatively, referring to FIG. 6, the patterned photoresist layer 160 includes a first area Z31, a second area Z32, and a third area Z21 located between the first area Z31 and the second area Z32. The thickness of the third area Z21 ranges from 0.2 to 0.8 microns. Wherein the portion covered by the first area Z31 may be also referred to as a source electrode forming area of the active switch for forming the source electrode of the active switch after the step of the subsequent etching. The portion covered by the second area Z32 may be also referred to as a drain electrode forming area of the active switch for forming the drain electrode of the active switch after the step of the subsequent etching. The portion covered by the third area Z21 may be also referred to as a channel forming area of the active switch for forming the channel area of the active switch after the step of the subsequent etching.

Optionally, the photoresist layer 160 is patterned using a half-tone mask process, and the required illumination energy corresponding to the exposure of the third area Z21 is in the range of 37-48 millijoules.

Figure 14:
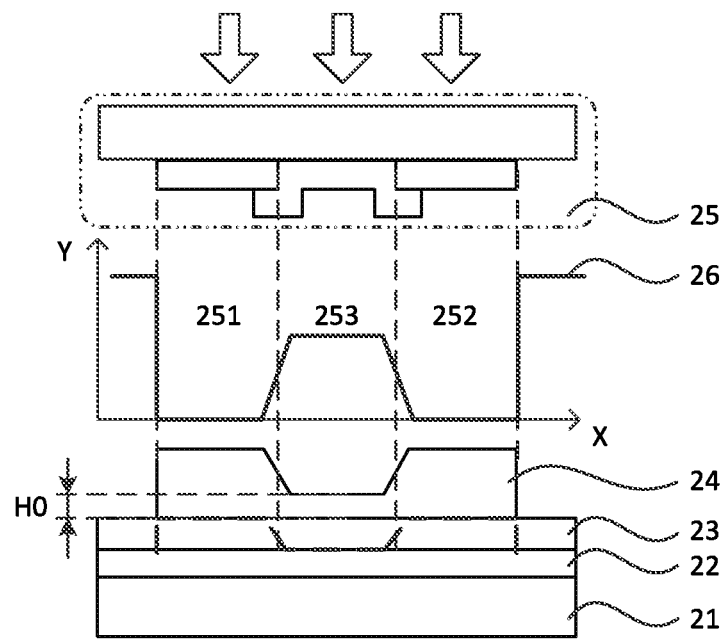
FIG. 14 is a principle schematic diagram of a patterned photoresist layer according to an embodiment of the present disclosure.

Exemplarily, FIG. 14 is a schematic diagram of the principle of the patterned photoresist layer according to an embodiment of the present disclosure. Referring to FIG. 14, the exposed sample exemplarily includes a photoresist layer 24, a source drain electrode layer 23, other functional layer 22 (which may include a semiconductor layer, a gate insulating layer and a gate electrode layer, shown generally as 22 in FIG. 14), and a substrate 21. The half-tone mask 25 may exemplarily include three areas: a first area 251 corresponding to a source electrode forming area of the exposed sample, a second area 252 corresponding to a drain electrode forming area of the exposed sample, and a third area 253 located between the first area 251 and the second area 252 corresponding to a channel forming area of the exposed sample. Since the first area 251, the second area 252 and the third area 253 of the half-tone mask 25 are different in light transmittance, the degree of exposure of the incident lights to the photoresist layer 24 after passing through the half-tone mask 25 is different, thereby the patterned photoresist layer 24 is formed. In FIG. 14, in an X-Y coordinate system, X represents different positions (unit as nanometers or micrometers, depending on the actual requirement of the active switch, which is not limited herein) of the exposed sample (mainly referring to the photoresist layer 24) corresponding to the half-tone mask, and Y represents exposure energy (unit as millijoule); and the broken line 26 represents a changing trend in the exposure energy corresponding to different locations. The photoresist layer 24 at the position where corresponding to the first area 251 and the second area 252 of the half-tone mask 25 is less removed, and then the corresponding remaining thickness is thicker, since there is less light transmitted through the half-tone mask 25 and the corresponding exposure energy is smaller. The photoresist layer 24 at the position where corresponding to the third area 253 of the half-tone mask 25 is removed more, and then the corresponding remaining thickness is thinner (H0 represents the remaining thickness of the photoresist layer 24 in FIG. 14), since there is more light transmitted through the half-tone mask 25 and the corresponding exposure energy is larger. The photoresist layer 24 is different in thickness corresponding to different positions to form the patterned photoresist layer 24.

Figure 15:
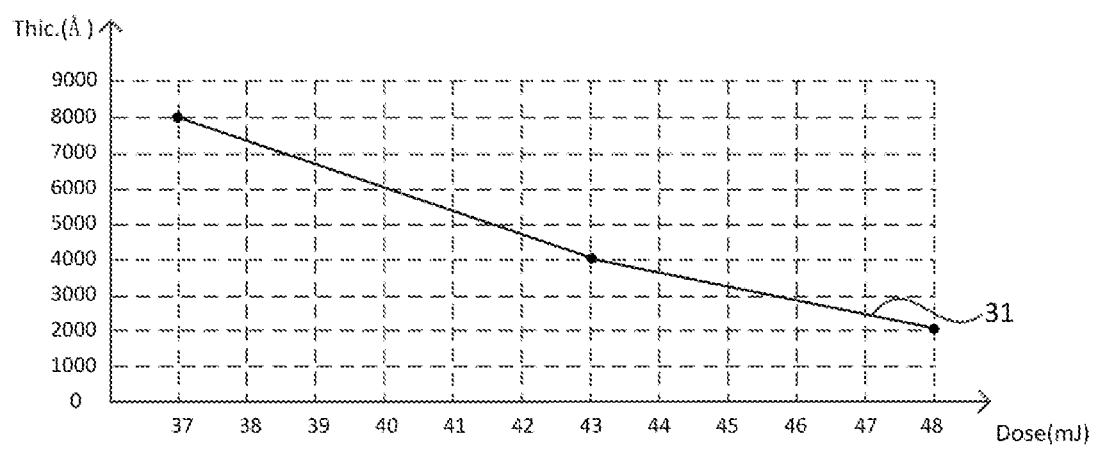
FIG. 15 is a schematic diagram showing a relationship between exposure energy and a remaining thickness of a photoresist layer according to an embodiment of the present disclosure.

Exemplarily, FIG. 15 is a schematic diagram showing the relationship between the exposure energy and the remaining thickness of the photoresist layer according to an embodiment of the present disclosure. Combined with FIG. 14 and FIG. 15, the horizontal axis represents the exposure energy Dose in a unit of millijoule (mJ); the vertical axis represents the remaining thickness Thic. of the photoresist layer 24 in a unit of angstrom (Å); and the broken line 31 represents the correspondence between the remaining thickness Thic. of the photoresist layer 24 and the exposure energy Dose. The exposure energy Dose is controlled to range within 37-48 millijoules, so that the remaining thickness Thic. of the photoresist layer 24 can be in the range of 2000-8000 angstroms, that is, 0.2-0.8 microns. This thickness range can ensure that in the subsequent process of etching the photoresist, the photoresist in the third area can be completely etched away. That is, when the active switch corresponding to the third area is completely exposed, the remaining thickness and the lateral dimension of the first area and the second area can ensure that the corresponding active switch structure can be effectively covered.

In one embodiment, when the remaining thickness of the photoresist layer is greater than or equal to 0.4 microns, 1.5 millijoules of the exposure energy are required for every 0.1 micron reduction in the remaining thickness of the photoresist layer.

In one embodiment, when the remaining thickness of the photoresist layer is less than 0.4 microns and greater than or equal to 0.2 microns, 2.5 millijoules of the exposure energy are required for every 0.1 micron reduction in the remaining thickness of the photoresist layer.

In one embodiment, the dry etching is over 10%.

In one embodiment, the over etching time is 76 seconds.

In one embodiment, the feature size loss on each side of the photoresist layer is 0.94 micron.

Figure 16:
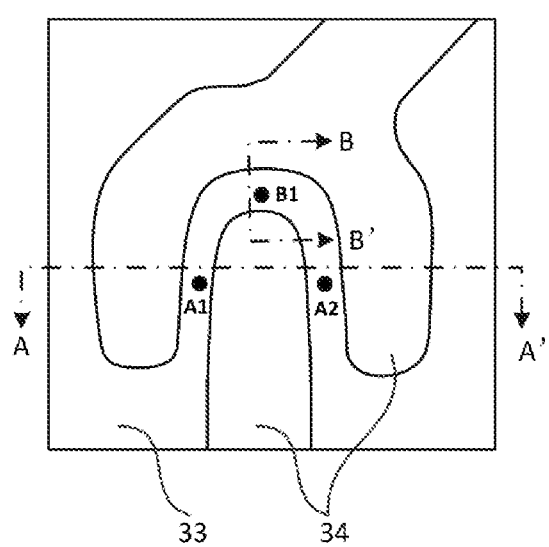
FIG. 16 is a top view of a photoresist layer after patterning according to an embodiment of the present disclosure.
Figure 17:
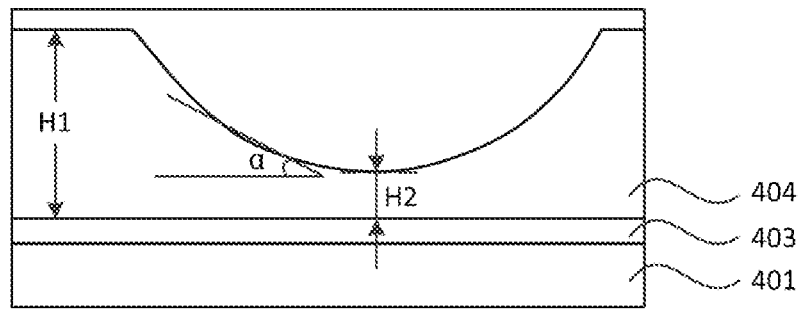
FIG. 17 is a cross-sectional structural view taken along a section line B-B' in the top view of FIG. 16.

Exemplarily, FIG. 16 is a top view of the photoresist layer after patterning according to an embodiment of the present disclosure. Referring to FIG. 16, the first area and the second area of the photoresist layer are exemplarily shown at 34 in FIG. 16, and the third area of the photoresist layer is shown at 33; and the locations with the minimum remaining thickness in the third area of the photoresist layer 24 are exemplarily shown at points A1, A2 and B1. Specifically, FIG. 17 is a cross-sectional structural view taken along a section line B-B' in the top view of FIG. 16. Referring to FIG. 17, a multi-layer functional layer 403 (which may include a gate electrode, a gate insulating layer, a semiconductor layer, and a source drain electrode layer, which are not specifically divided in FIG. 17 and all shown as 403) and a photoresist layer 404 are formed on a substrate 401. Combined with FIG. 16 and FIG. 17, a pit-like cross-section can be obtained by extending the photoresist layer 404 from the positions of the minimum remaining thickness in the third area of the photoresist layer 404 (that is, the positions indicated by A1, A2 and B1 in FIG. 16 and the position indicated by H2 in FIG. 17) to the first area and second area of the photoresist layer 404, as shown in FIG. 17.

In one embodiment, the remaining thickness of the first area of the photoresist layer is 1.8-2.2 microns and the remaining thickness of the second area of the photoresist layer is 1.8-2.2 microns.

In one embodiment, the surface of the third area of the photoresist layer forms a pit, and an inclination angle α of the surface of the pit ranges from 28 to 32°.

In one embodiment, the remaining thickness H1 of the first area and second area of the photoresist layer 24 is 2.174 microns. The remaining thickness H2 of the third area is 0.54 microns. And the value of the angle α between the pit surface and the interface of the photoresist layer 404 and the multi-layer functional layer 403 is 30.69°.

In one embodiment, the remaining thickness uniformity of the third area of the photoresist layer ranges from 25% to 55%.

Wherein, the uniformity characterizes the flatness of the remaining thickness of the third area, and exemplarily, a calculation method for the value of the uniformity may adopt the following formula:

$$U\% = \left| \frac{H\max - H\min}{2 * \text{Average}} \right|.$$

Wherein Hmax represents a maximum value of the remaining thickness of the third area, Hmin represents a minimum value of the remaining thickness of the third area, and Average represents an average value of the remaining thickness of the third area. The smaller the value of the uniformity U % is, the better the uniformity of the remaining thickness of the third area of the photoresist layer is.

Figure 18:
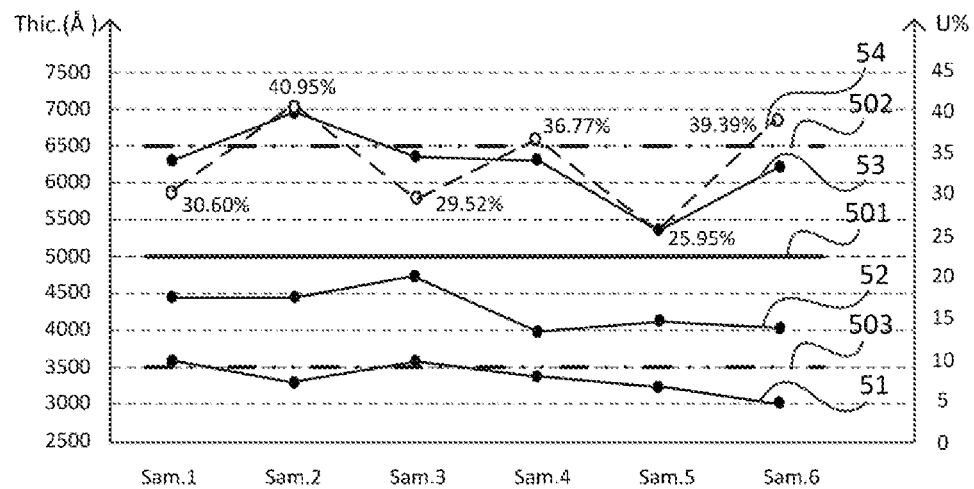
FIG. 18 is a schematic diagram of a remaining thickness of a third area of a photoresist layer of 6 different samples according to the embodiments of the present disclosure.

Exemplarily, FIG. 18 is a schematic diagram of the remaining thickness of the third area of the photoresist layer of 6 different samples according to the embodiments of the present disclosure. Combined with FIGS. 14 and 18, the horizontal axis represents different sample numbers, Sam. 1-Sam. 6 represent six samples with different sizes, and the two vertical axes represent respectively the remaining thickness Thic. and the remaining thickness uniformity U % of the photoresist layer 24. The unit of the remaining thickness Thic. of the photoresist layer 24 is angstrom (Å). The straight line 501 represents an average value of the remaining target thickness of the photoresist layer 24, which may exemplarily be 0.5 microns. The straight line 502 represents a maximum value of the remaining target thickness of the photoresist layer 24, which may exemplarily be 0.65 microns. The straight line 503 represents a minimum value of the remaining target thickness of the photoresist layer 24, which may exemplarily be 0.35 microns. The dots on broken line 51 represent a minimum value of the actual remaining thickness of the photoresist layer 24, which may exemplarily be in a range of 0.3-0.36 microns. The dots on broken line 53 represent a maximum value of the actual remaining thickness of the photoresist layer 24, which may exemplarily be in a range of 0.54-0.69 microns. The dots on the broken line 52 represent an average value of the actual remaining thickness of the photoresist layer 24, which may exemplarily be in a range of 0.4 to 0.47 microns. The dots on the broken line 54 represent the uniformity of the actual remaining thickness of the photoresist layer 24, which may exemplarily be in a range of 25.95% to 40.95%.

In the manufacturing method for the array substrate provided by the embodiments of the present disclosure, by adding the step of the photoresist ashing, the coverage of the photoresist layer 160 to the semiconductor layer (including the active layer 130 and the doped layer 140) is reduced, so that in the step of the dry etching, the semiconductor layer (including the active layer 130 and the doped layer 140) which can be etched away is increased, i.e., in the active switch finally formed, the portion of the semiconductor layer (including the active layer 130 and the doped layer 140) exceeding the source drain electrode layer 150 is reduced (including that the portion of the active layer 130 exceeding the source electrode 15*a* and the drain electrode 15*b* is reduced, and the portion of the doped layer 140 exceeding the source electrode 15*a* and the drain electrode 15*b* is reduced). It reduces the probability of absorbing light and generating photo-generated carriers of the semiconductor layer in the active switch, reduces the leakage current of the active switch on the array substrate, and correspondingly improves the stability of the active switch.

Figure 19:
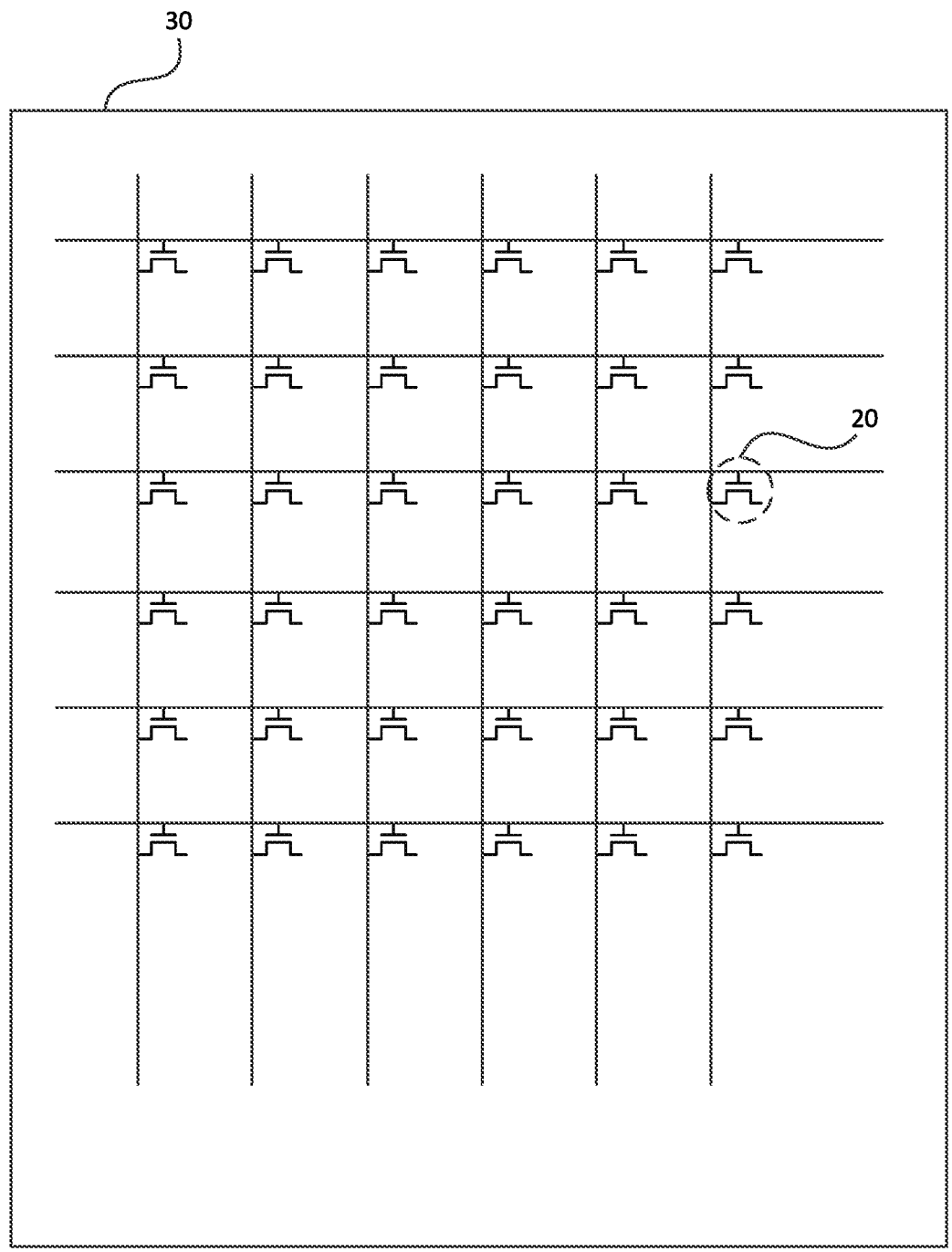
FIG. 19 is a structural schematic diagram of an array substrate according to an embodiment of the present disclosure.
Figure 20:
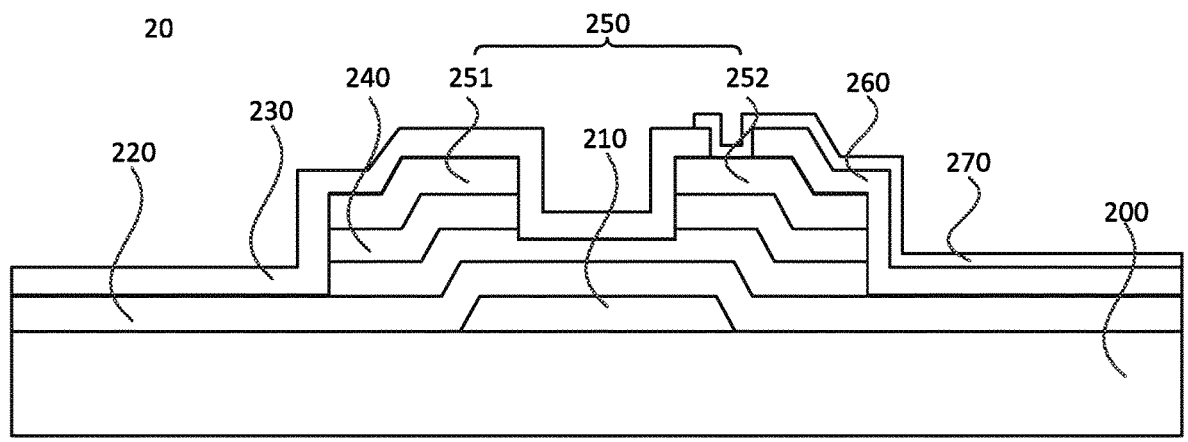
FIG. 20 is a structural schematic diagram of an active switch on an array substrate according to an embodiment of the present disclosure.

FIG. 19 is a structural schematic diagram of an array substrate according to an embodiment of the present disclosure. Referring to FIG. 19, a plurality of active switches 20 are formed on an array substrate 30, and the active switches are formed by the manufacturing method provided in the above embodiments. FIG. 20 is a structural schematic diagram of an active switch on an array substrate according to an embodiment of the present disclosure. Referring to FIG. 20, the active switch 20 includes a substrate 200; a gate electrode 210, a gate insulating layer 220, a semiconductor layer (including an active layer 230 and a doped layer 240), a source electrode 251 and a drain electrode 252 (a source drain electrode 250) formed on the substrate 200, wherein a distance between a projection contour of the active layer 230 on the substrate 200 and a projection contour of the source electrode 251 or the drain electrode 252 on the substrate 200 is less than 1.2 microns, and the distance between the projection contour of the doped layer 240 on the substrate 200 and the projection contour of the source electrode 251 or the drain electrode 252 on the substrate 200 is less than 0.8 microns.

It should be noted that FIG. 19 exemplarily shows the active switches arranged in 6 rows and 6 columns, but is not the limitation of the array substrate of the present disclosure. The number and arrangement of the active switches may be designed according to the actual requirements of the array substrate. FIG. 20 exemplarily shows that the distance between the projection contour of the active layer 230 on the substrate 200 and the projection contour of the source electrode 251 or the drain electrode 252 on the substrate 200 is equal to 0; and the distance between the projection contour of the doped layer 240 on the substrate 200 and the projection contour of the source electrode 251 or the drain electrode 252 on the substrate 200 is equal to 0.

The array substrate provided by an embodiment of the present disclosure is manufactured by the above method. In the manufacturing method for the array substrate, by adding the step of the photoresist ashing, the coverage of the photoresist layer 160 to the semiconductor layer (including the active layer 130 and the doped layer 140) is reduced, so that in the step of the dry etching, the semiconductor layers (including the active layer 130 and the doped layer 140) which can be etched away is increased, i.e., in the active switch finally formed, the portion of the semiconductor layer (including the active layer 130 and the doped layer 140) exceeding the source drain electrode layer 150 is reduced (including that the portion of the active layer 130 exceeding the source electrode 15a and the drain electrode 15b is reduced, and the portion of the doped layer 140 exceeding the source electrode 15a and the drain electrode 15b is reduced). It reduces the probability of absorbing light and generating photo-generated carriers of the semiconductor layer in the active switch, reduces the leakage current of the active switch on the array substrate, and correspondingly improves the stability of the active switch.

Figure 21:
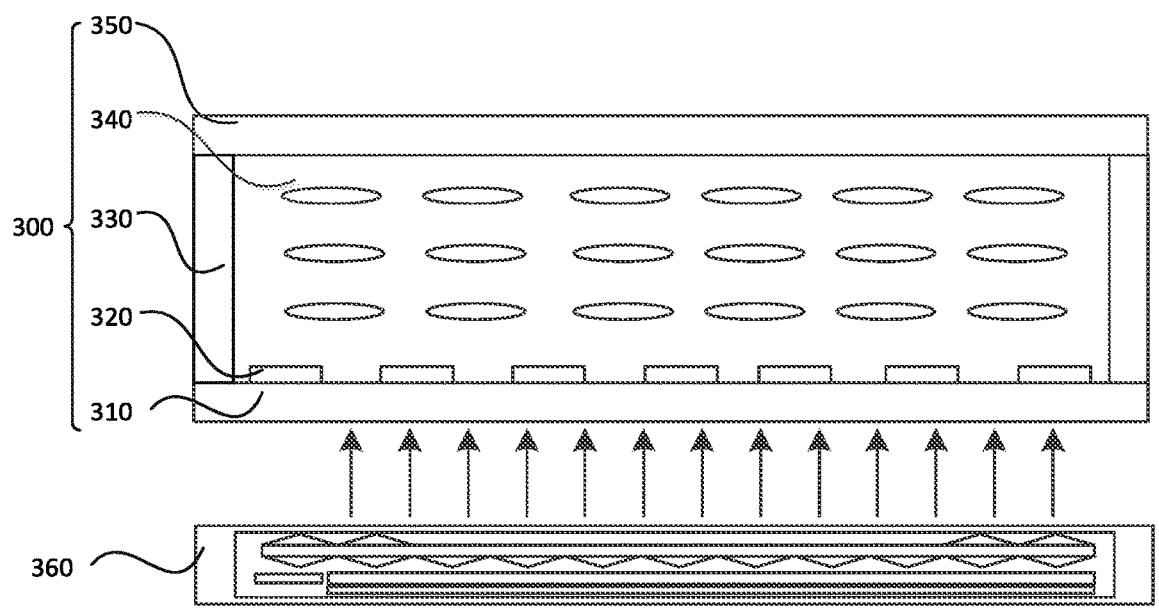
FIG. 21 is a structural schematic diagram of a liquid crystal display device according to an embodiment of the present disclosure.

A liquid crystal display device is also provided according an embodiment of the present disclosure. FIG. 21 is a structural schematic diagram of a liquid crystal display device according to an embodiment of the present disclosure. Referring to FIG. 21, the display device includes a display panel 300 and a backlight module 360. The display panel 300 includes an array substrate 310 provided as described above. The backlight module 360 is arranged on one side of the display panel 300. In FIG. 21, it only exemplarily shows that the backlight module 360 is arranged below the display panel 300.

Exemplarily, the display panel 300 includes an array substrate 310, pixel electrodes 320, an encapsulation layer 330, a liquid crystal molecule layer 340, and a common electrode 350. The rotation of liquid crystal molecules in the liquid crystal molecule layer 340 is controlled by applying an electric field between the pixel electrodes 320 and the common electrode 350, thereby the display is realized.

It should be noted that, as shown in FIG. 20, the active switch is electrically connected via hole to the pixel electrode 270 (the pixel electrode 320 in FIG. 21) through the insulating layer 260, so that the data line signal is transmitted to the corresponding pixel electrode 270 (the pixel electrode 320 in FIG. 21) when being turned on. The other structures of the liquid crystal display device are not specifically shown herein. Compared with the example technologies, in the manufacturing method for the active switch, by adding the step of the photoresist ashing, the coverage of the photoresist layer 160 to the semiconductor layer (including the active layer 130 and the doped layer 140) is reduced, so that in the step of the dry etching, the semiconductor layers (including the active layer 130 and the doped layer 140) which can be etched away is increased, i.e., in the active switch finally formed, the portion of the semiconductor layer (including the active layer 130 and the doped layer 140) exceeding the source drain electrode layer 150 is reduced (including that the portion of the active layer 130 exceeding the source electrode 15a and the drain electrode 15b is reduced, and the portion of the doped layer 140 exceeding the source electrode 15a and the drain electrode 15b is reduced). It reduces the probability of absorbing light and generating photo-generated carriers of the semiconductor layer in the active switch, reduces the leakage current of the active switch, and correspondingly improves the stability of the active switch.

It should be noted that the above is merely embodiments of the present disclosure and the applied technical principles. It will be understood by those skilled in the art that the present disclosure is not limited to the particular embodiments described herein, and that various obvious changes, readjustment, mutual combination, and substitution can be made by those skilled in the art without departing from the scope of the disclosure. Accordingly, although the present disclosure has been described in detail through the above embodiments, the present disclosure is not limited to the above embodiments, but may include more other equivalent embodiments without departing from the concept of the present disclosure, the scope of which is determined by the scope of the appended claims.

What is claimed is:

1. A method for manufacturing an array substrate, the array substrate comprising an active switch, and the method comprising:

providing a substrate;

forming a gate electrode, a gate insulating layer, a semiconductor layer, a source drain electrode layer and a photoresist layer on the substrate, wherein the semiconductor layer comprises an active layer and a doped layer;

patterning the photoresist layer to form a patterned photoresist layer thereby creating a pattern photoresist layer, wherein the patterned photoresist layer comprises a first and second thickness areas, and wherein a first thickness area thickness is less than a second thickness area thickness;

performing at least one wet etching on the source drain electrode layer to form a source electrode and a drain electrode of the active switch and performing at least one dry etching on the semiconductor layer to form a channel area of the active switch using the patterned photoresist layer; and performing at least one photoresist ashing between the steps of wet etching and the dry etching;

wherein a ratio of a lateral etching rate to a longitudinal etching rate in the at least one photoresist ashing ranges from 1:0.9 to 1:1.5; and wherein the wet etching comprises a first-time wet etching and a second-time wet etching, the dry etching comprises a first-time dry etching and a second-time dry etching, and the first-time wet etching, the first-time dry etching, the second-time wet etching, and the second-time dry etching are performed in sequence.

2. A method according to claim 1, wherein the photoresist ashing comprises a first-time photoresist ashing, a second-time photoresist ashing and a third-time photoresist ashing, wherein the first-time photoresist ashing is performed between the first-time wet etching and the first-time dry etching, wherein the second-time photoresist ashing is performed between the first-time dry etching and the second-time wet etching, and wherein the third-time photoresist ashing is performed between the second-time wet etching and the second-time dry etching.

3. A method according to claim 1, wherein in the photoresist ashing, an etching gas comprises at least one of sulfur hexafluoride and oxygen.

4. A method according to claim 3, wherein the etching gas is oxygen, the ratio of the lateral etching rate to the longitudinal etching rate is 1:0.9.

5. A method according to claim 3, wherein the etching gas comprises sulfur hexafluoride and oxygen, a flow ratio of sulfur hexafluoride and oxygen ranges from 0.02-0.1, and the ratio of the lateral etching rate to the longitudinal etching rate is 1:1.5.

6. A method according to claim 5, wherein a flow rate of sulfur hexafluoride is 200-800 sccm.

7. A method according to claim 5, wherein a flow rate of oxygen is 8000-10000 sccm.

8. A method according to claim 1, wherein the gate insulating layer is a silicon nitride layer.

9. A method according to claim 1, wherein the active layer is one of a polysilicon layer and an amorphous silicon layer.

10. A method according to claim 1, wherein the doped layer is one of a heavily doped polysilicon layer and a heavily doped amorphous silicon layer.

11. A method according to claim 1, wherein the source drain electrode layer comprises a molybdenum nitride layer, an aluminum layer, and a molybdenum nitride layer stacked in layers.

12. A method according to claim 1, wherein the photoresist layer covering the semiconductor layer is partly removed by the photoresist ashing.

13. A method according to claim 1,
wherein the gate electrode is located on the substrate;
wherein the gate insulating layer is located on the gate electrode;
wherein the semiconductor layer is located on the gate insulating layer, the doped layer is located on the active layer, and the doped layer comprises a first area and a second area isolated from each other;
wherein the source electrode is located on the first area of the doped layer and the drain electrode is located on the second area of the doped layer; and
wherein a distance between an active layer projection contour on the substrate and one of a source electrode projection contour and a drain electrode projection contour on the substrate is less than 1.2 microns; and the distance between a doped layer projection contour on the substrate and one of the source electrode projection contour said the drain electrode projection contour on the substrate is less than 0.8 microns.

14. A method for manufacturing a transistor of an array substrate, comprising:
forming a gate electrode on a substrate;
forming a gate insulating layer on the gate electrode;
forming a semiconductor layer on the gate insulating layer, wherein the semiconductor layer comprises an active layer and a doped layer on the active layer;
forming a source drain electrode layer on the doped layer;
forming a photoresist layer on the source drain electrode layer;
exposing and developing the photoresist layer to obtain a first photoresist pattern, the first photoresist pattern comprising a first and second thickness areas and a hollow area, wherein a first thickness area thickness is less than a second thickness area thickness, and wherein the hollow area exposes the source drain electrode layer;
performing a first-time wet etching on the source drain electrode layer, and taking the first photoresist pattern as a first mask;
performing a first-time ashing processing on the first photoresist pattern to obtain a second photoresist pattern;
performing a first-time dry etching on the semiconductor layer, and taking the second photoresist pattern as a second mask;
performing a second-time ashing processing on the second photoresist pattern to obtain a third photoresist pattern, wherein the first thickness area is removed in the second ashing processing;
performing a second-time wet etching on the source drain electrode layer to form a source electrode and a drain electrode of a transistor, and taking the third photoresist pattern as a third mask;
performing a third-time ashing processing on the third photoresist pattern to obtain a forth photoresist pattern;
performing a second-time dry etching on the doped layer to form a channel area of the transistor, and taking the forth photoresist pattern as a forth mask; and
removing the forth photoresist pattern,
wherein in the first-time ashing processing, the second-time ashing processing and the third-time ashing processing, a ratio of a lateral etching rate to a longitudinal etching rate ranges from 1:0.9~1:1.5.

15. A method according to claim 14, wherein in the first-time ashing processing, the second-time ashing processing, and the third-time ashing processing, an etching gas used comprises at least one of sulfur hexafluoride and oxygen.

16. A method according to claim 15, wherein the etching gas is oxygen, and the ratio of the lateral etching rate to the longitudinal etching rate is 1:0.9.

17. A method according to claim 15, wherein the etching gas is a mixture of sulfur hexafluoride and oxygen, and a flow ratio of sulfur hexafluoride and oxygen ranges from 0.02-0.1, and wherein the ratio of the lateral etching rate to the longitudinal etching rate is 1:1.5.

18. A method according to claim 17, wherein a flow rate of sulfur hexafluoride is 200-800 sccm.

19. A method according to claim 17, wherein a flow rate of oxygen is 8000-10000 sccm.

* * * * *